United States Patent [19]

Schroder

[11] 4,185,322

[45] Jan. 22, 1980

[54] ELIMINATION OF NOISE IN THE OPERATION OF A STRESS CONTROLLED MEMORY

[76] Inventor: Klaus Schroder, 7226 Coventry Rd., East Syracuse, N.Y. 13057

[21] Appl. No.: 749,105

[22] Filed: Dec. 9, 1976

[51] Int. Cl.² .................................................. G11C 7/02
[52] U.S. Cl. ..................................... 365/209; 365/145; 365/157
[58] Field of Search ................ 340/174 MS, 173 MS, 340/173.2; 360/56; 365/157, 145, 206, 209; 346/74.1

[56] References Cited

U.S. PATENT DOCUMENTS

| 3,535,686 | 10/1970 | Barnett | 340/173.2 |
| 3,890,604 | 6/1975 | Schroder | 340/174 MS |
| 4,031,525 | 6/1977 | Volz et al. | 340/174 MS |

Primary Examiner—James W. Moffitt

[57] ABSTRACT

Data can be stored in a 1,2, or 3-dimensional memory by lining up the permanent dipole of small particles using a superposition of ultrasonic pulses and applied fields. Signals due to dipole orientation changes in particles with lower coercive fields than the design coercive field may lead to a large "noise" signal which disturbs the readout. This "noise" signal can be eliminated by applying a field with or without stress to the sample which lines up all dipoles with too low coercive fields. Afterwards the standard procedure to "read" the memory is used, which is undisturbed by the "noise" due to flipping of dipoles with too low coercive fields, if the field applied during "reading" is parallel to the field used to flip particles with too low critical fields.

5 Claims, 1 Drawing Figure

ELIMINATION OF NOISE IN THE OPERATION OF A STRESS CONTROLLED MEMORY

BACKGROUND OF THE INVENTION

This invention relates to a new method of a readout for a 1, 2, or 3-dimensional memory device. Information is stored in magnetic memories by orientating the magnetization of ferromagnetic units like cores, or magnetic powder particles. Typically, a core, which is a ring shaped magnet, may be magnetized clockwise or anticlockwise. Each state represents a given unit like a "zero" or "one", or a "plus" or "minus". A "readout" device makes it possible to determine the magnetic orientation of these magnetic units. This can be done electromagnetically, as e.g. in the case of magnetic cores, where a change in the magnetization of a core leads to an induced voltage in a wire going through the center of the core. The magnetic orientation of magnetic particles can be determined also optically, since the orientation of the polarization plane of a polarized light beam will be rotated if it interacts with a magnetic material. The rotation can be quite large, if light is sent in transmission through a ferromagnetic or ferrimagnetic material. This is the Faraday effect, where rotation of $10^3$ to $10^5$ deg/cm can be found in materials like iron, or cobalt and in compounds like BiMn. This has been discussed in detail by J. F. Dillon, Journal of Appl. Physics, Vol 39, p. 922, 1968. The reflection of polarized light on ferromagnetic surfaces leads again to a rotation of the orientation of the polarization plane. This is the Kerr-effect. Typical rotations are less than 1 deg. In BiMn, values of about 1 deg. have been found.

It has been shown recently (Klaus Schroder, "Selective Dipole Orientation of Individual Volume Elements of a Solid Body," U.S. Pat. No. 3,890,604), that one can construct a 3-dimensional memory, in which "bits of information" are stored by superimposing ultrasonic pulses and a magnetic field in such a way that only one selected volume element has a higher stress than the rest of the material. The applied field H was selected in such a way that only in the highest stressed section the applied field was large enough to change the magnetization direction. This made it possible to "write" a bit of information into the magnetic memory. One would "read" if the magnetization of a magnetic particle was lined up in a given direction by superimposing again in the same time sequence the same set of ultrasonic pulses and the magnetic field used to "write". If the field H was parallel to the magnetic orientation, a zero average voltage would be induced in a sense coil surrounding the sample. However, a change in the magnetization direction of the particle due to the fact that it was antiparallel aligned to the field H and now changed to a magnetization direction parallel to H leads to an induced voltage in the sense coil surrounding the sample. Similarly to the memory with magnetic particles, one can use a memory with ferroelectric particles in a non-ferroelectric matrix. This system has been described in detail in the patent "K. Schroder 'Selective Dipole Orientations of Individual Volume Elements in a Solid Body' U.S. Pat. No. 3,890,604".

SUMMARY OF INVENTION

The invention proposes a simple method which allows it to eliminate signals due to rotation of dipoles with too low critical field. The memory matrix is initially subjected to a field which is too small to switch particles with the design coercive field or even larger coercive fields. This initial field is parallel to the field direction used in the "readout" process. Since now all particles with too low coercive fields are parallel to the field for the readout process, they will not induce signals in the standard readout procedure.

DETAILED DESCRIPTION

Figure 1:
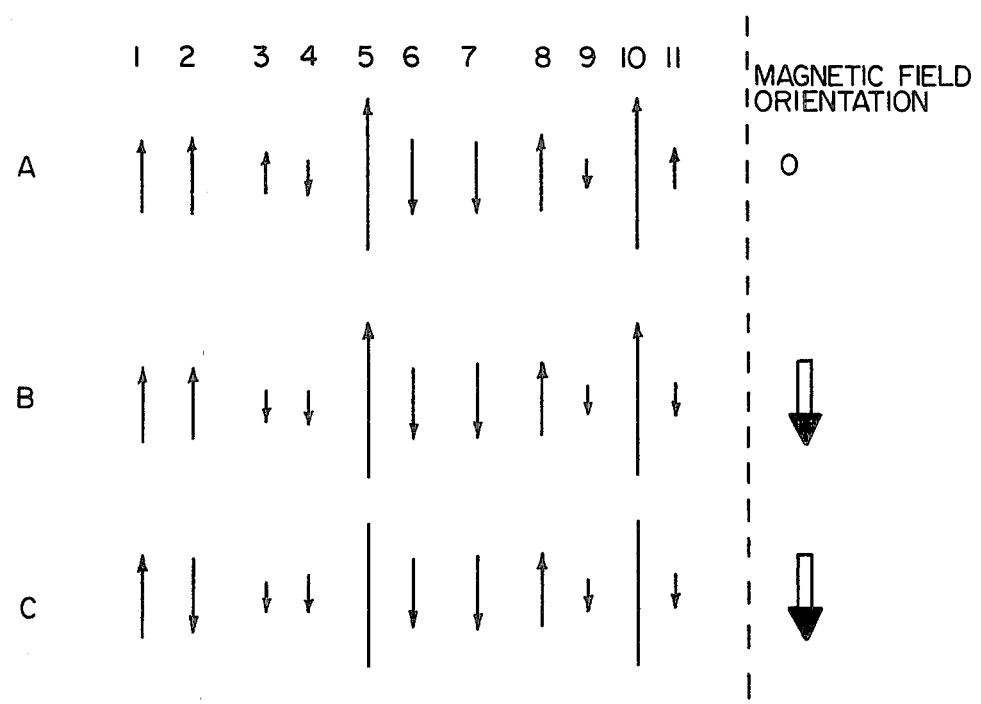

In the description of the memory in the 'Background of the Invention' it was assumed, that all particles had a nearly uniform coercive force $H_c$. However, one can use such a system of small particles as a memory even if some particles have either substantially higher or smaller $H_c$ values than the remainder of the particles. Particles with higher $H_c$ values will not flip even if they are subjected to the maximum stress waves and field. Their effect can be neglected. However, those particles with lower $H_c$ values than the average particle may flip even if they are not subjected to the maximum stress applied to another volume element to be tested. Fortunately, it is possible to eliminate signals from all particles with too small $H_c$ values. This can be shown in a simple example. Let us assume that $H_c^o$ is the coercive field of most particles at zero stress, $H_c' = H_c^o - \Delta H'$ the coercive field if 3 stress waves overlap, and $H_c'' = H_c^o - \Delta H''$ the coercive field of those particles if they are subjected to the stress of 6 stress waves. Should there be a particle with the coercive force $h_c^o < H_c^o$, and $\Delta h'$ its change due to stress waves, then $h_c^o - \Delta h'$ may be smaller than the applied field H selected in such a way that $H_c' < H < H_c'$. This means that this volume element may flip even if only 3 stress waves will overlap at its position. Its flipping would produce an unwanted signal, which will be referred to as a "noise" signal. However, one can eliminate signals from particles with small $h_c$ values. One applies first a field H to the sample which is slightly smaller than $H_c^o$, but larger than $h_c^o$. This field will line up all dipoles of particles with small coercive forces. Then one reduces this field to the level required to test particle orientations of particles with the design coercive field.

FIG. 1 gives a 1-dimensional schematic diagram of the proposed process. The thin arrows represent ferromagnetic particles. The length of the thin arrow is proportional to the coercive field required for orientation reversal under zero stress. Row A, numbers 1 to 11 shows the initial dipole orientations. The arrows, 1, 2, 6, 7, and 8 are ferromagnetic particles with such coercive field that they would rotate under an applied superposition of stresses and a field opposite to the dipole orientation. The particles 5 and 10 will never rotate, where as the particles 3, 4, 9, and 11 will rotate under an opposing field even if stresses are low. Before the readout process on particles 1, 2, 6, 7, and 8 can be started, a field and stress just large enough to rotate the particles 3, 4, 9, and 11 is applied. This leads to a dipole orientation shown in row B, where the applied field (thick arrow) points down, and where the dipole orientation of the particles 3, 4, 9, and 11 also are lined up downwards. Then the stress waves are generated in such a way that they overlap, e.g. at particle 2. Now only the particle at 2 with medium size coercive field will rotate and no other particle. The resulting dipole orientations are shown in row C. In reality, one finds a continuous spectrum of coercive forces or coercive fields. A typical example may be material in which the magnetic particles have the composition BiMn for which one can calculate the coercive forces, if these particles undergo a coherent rotation (K. Schroder, Phys. Stat. Sol., 40, 1975, pp. K145). The effect due to fanning and curling are small and can in first approximation be neglected (T. O. Paine, in: Magnetic Properties of Metals and Alloys, ASM, Cleveland 1958, pp. 149). For simplicity, it is further assumed that all BiMn particles are lined up in one direction, and that one can calculate the coercive fields from Stoner-Wohlfarth theory of coherent rotation (see e.g. A. H. Morrish, The Physical Principles of Magnetizing, Wiley, New York, 1965, pp. 340). Experiments indicate that this is a reasonable approximation. At room temperature, the coercive force is given by $H_c = 2K/M + (N_a - N_b) M + 3\lambda\sigma/M$ if the BiMn particles are ellipsoids, with the axis of uniaxial symmetry parallel to the direction of easy magnetization. K is the crystal anisotropy constant, M the magnetization, and $N_a$, $N_b$ are the demagnetization constants. $\sigma$ is the stress, and $\lambda$ the saturation magnetostriction. All the parameters are given in cgs units. For BiMn, one finds at room temperature $K \simeq 1.1 \times 10^7$ ergs/cm$^3$ and M=660 G. $N_a - N_b$ can have values from $+2\pi$ (needle shaped BiMn particles) to $-4\pi$ (disk shape particles). $N_a - N_b$ is zero for a spherical particle.

The coercive force for unstressed BiMn precipitates can range from about 37 kOe for needles to 25 kOe for disks. The coercive force for a sphere is about 33 kOe. Let us assume that the stress waves are selected in such a way that the stress waves move in the direction of the uniaxial symmetry of the BiMn particles, that one stress wave reduces the coercive force by 1 kOe, and the superposition of two stress waves reduces the coercive force by 1.41 kOe. In that case, a range of particle shapes which would have as coercive forces in the unstressed state values from 32.8 to 33.2 kOe would lead to a memory which would not be effected by "noise" from particles with coercive fields even as low as 32.8 kOe. Applying a field of 32.9 kOe at zero stress would line up all BiMn particles which could lead to noise signals, leaving an extra margin of safety.

As mentioned before, particles with too high a coercive force (in this case $H_c$ above 33.2 kOe) will not present a problem. However, one can modify the procedure of the memory operation and completely eliminate the effect of too large particles. For instance, one could select the suitable particle range in such a way that only needle shaped BiMn precipitates will be used. Then the maximum coercive force is $2K/M + 2\pi M = $ kOe. Selecting for the operation of the memory for coercive forces in zero stress from 36.8 kOe to higher values leads to a system in which particles can have only too small, never too large coercive forces.

This is only one possible way for the operation of the memory where magnetic or ferroelectric particles have not a unique value of the coercive field. One may also use combinations of magnetic or electric fields and one or several stress waves to line up particles with too low coercive fields parallel to the field applied for a "readout" operation. Other forms or modes of specific practice of the invention will be readily apparent from an understanding of the disclosed invention.

What is claimed is:

1. I claim a system of eliminating "noise" signals in a stress wave controlled memory consisting of a nonmagnetic matrix with ferromagnetic particles with a range of coercive fields by applying a field to the memory before reading the memory which is so large that it will line up particles with permanent dipoles with too low coercive fields, eliminating thereby noise signals which interfere with reading the memory.

2. I claim an invention according to claim (1) in which a field and one stress wave is applied to line up particles with too low coercive fields in a preferred orientation.

3. I claim an invention according to claim (1) in which a field and several stress waves are applied to the memory to line up particles in a preferred orientation.

4. I claim an invention according to claim (2) in which the particles are ferromagnetic particles, and the fields are magnetic fields.

5. I claim an invention according to claim (2) in which the particles are ferrimagnetic particles, and the fields are magnetic fields.